(12) United States Patent
Dutt

(10) Patent No.: US 9,653,639 B2
(45) Date of Patent: May 16, 2017

(54) LASER USING LOCALLY STRAINED GERMANIUM ON SILICON FOR OPTO-ELECTRONIC APPLICATIONS

(75) Inventor: Birendra Dutt, Westchester, CA (US)

(73) Assignee: Apic Corporation, Culver City, CA (US)

(*) Notice: Subject to any disclaimer, the term of this patent is extended or adjusted under 35 U.S.C. 154(b) by 128 days.

(21) Appl. No.: 13/368,162

(22) Filed: Feb. 7, 2012

(65) Prior Publication Data
US 2013/0202005 A1 Aug. 8, 2013

(51) Int. Cl.
| | |
|---|---|
| *H01L 21/00* | (2006.01) |
| *H01L 31/109* | (2006.01) |
| *H01L 29/165* | (2006.01) |
| *H01L 31/18* | (2006.01) |
| *H01S 5/026* | (2006.01) |
| *H01S 5/10* | (2006.01) |
| *H01S 5/30* | (2006.01) |
| *H01S 5/32* | (2006.01) |
| *H01S 5/227* | (2006.01) |
| *H01S 5/02* | (2006.01) |
| *H01S 5/20* | (2006.01) |

(52) U.S. Cl.
CPC .......... *H01L 31/109* (2013.01); *H01L 29/165* (2013.01); *H01L 31/1804* (2013.01); *H01L 31/1812* (2013.01); *H01S 5/0264* (2013.01); *H01S 5/0265* (2013.01); *H01S 5/1071* (2013.01); *H01S 5/1082* (2013.01); *H01S 5/2272* (2013.01); *H01S 5/3027* (2013.01); *H01S 5/3201* (2013.01); *H01S 5/021* (2013.01); *H01S 5/2063* (2013.01); *Y02E 10/547* (2013.01); *Y02P 70/521* (2015.11)

(58) Field of Classification Search
CPC ........ H01L 21/329; H01L 21/20; H01L 21/00
USPC ........... 438/31, 50, 91, 94; 372/50, 20, 50.1; 257/96, 184, E31.012, E31.067, E33.006, 257/E21.352; 398/200
See application file for complete search history.

(56) References Cited

U.S. PATENT DOCUMENTS

| | | | | |
|---|---|---|---|---|
| 5,006,912 A | * | 4/1991 | Smith | ................. H01L 29/7378 257/197 |
| 5,381,426 A | | 1/1995 | Fontana et al. | |
| 5,534,713 A | * | 7/1996 | Ismail | ................. H01L 21/8256 257/190 |

(Continued)

FOREIGN PATENT DOCUMENTS

| | | |
|---|---|---|
| WO | WO 0174708 A2 * | 10/2001 |
| WO | WO0174708 A2 | 10/2001 |
| WO | WO 2012/079113 A1 * | 6/2012 |

OTHER PUBLICATIONS

Ahn, Donghwan et al., High Performance, Waveguide Integrated Ge Photodetectors, Optics Express 3916, vol. 15, No. 7, Apr. 2007, 6 pages.

(Continued)

*Primary Examiner* — Jessica Manno
*Assistant Examiner* — Sheikh Maruf
(74) *Attorney, Agent, or Firm* — Berkeley Law & Technology Group, LLP

(57) ABSTRACT

The subject matter disclosed herein relates to formation of silicon germanium devices with tensile strain. Tensile strain applied to a silicon germanium device in fabrication may improve performance of a silicon germanium laser or light detector.

25 Claims, 6 Drawing Sheets

(56) References Cited

U.S. PATENT DOCUMENTS

| | | | | |
|---|---|---|---|---|
| 5,568,502 A * | 10/1996 | Hironaka | | H01S 5/0264 372/46.01 |
| 5,998,781 A * | 12/1999 | Vawter | | H03C 1/34 250/227.11 |
| 6,537,370 B1 * | 3/2003 | Hernandez et al. | | 117/88 |
| 6,539,143 B1 * | 3/2003 | Hunter | | 385/19 |
| 6,580,733 B1 * | 6/2003 | Peale et al. | | 372/26 |
| 6,876,010 B1 * | 4/2005 | Fitzgerald | | H01L 21/02381 257/190 |
| 2002/0048289 A1 | 4/2002 | Atanackovic et al. | | |
| 2003/0017640 A1 * | 1/2003 | Foley Barenburg et al. | | 438/50 |
| 2003/0124761 A1 * | 7/2003 | Baert | | B81C 1/00666 438/50 |
| 2003/0153161 A1 * | 8/2003 | Chu | | H01L 21/02381 438/455 |
| 2003/0227057 A1 | 12/2003 | Lochtefeld et al. | | |
| 2003/0235931 A1 * | 12/2003 | Wada | | H01L 21/02381 438/22 |
| 2004/0241398 A1 * | 12/2004 | Notsu | | H01L 21/76259 428/195.1 |
| 2005/0153495 A1 * | 7/2005 | Liu | | 438/197 |
| 2005/0153595 A1 * | 7/2005 | Fuerst | | H01R 12/87 439/496 |
| 2005/0266591 A1 * | 12/2005 | Hideo | | 438/22 |
| 2006/0011916 A1 * | 1/2006 | Sakai | | H01L 21/02381 257/65 |
| 2006/0166467 A1 * | 7/2006 | Witvrouw | | H01L 21/0237 438/478 |
| 2007/0105251 A1 * | 5/2007 | Liu | | B82Y 20/00 438/22 |
| 2008/0013580 A1 * | 1/2008 | Kakinuma | | B82Y 20/00 372/43.01 |
| 2008/0173895 A1 * | 7/2008 | Maa | | H01L 21/02381 257/191 |
| 2008/0277647 A1 * | 11/2008 | Kouvetakis | | B82Y 20/00 257/19 |
| 2009/0218621 A1 * | 9/2009 | Pfirsch et al. | | 257/342 |
| 2010/0032812 A1 * | 2/2010 | Sedky | | B81C 1/00666 257/631 |
| 2010/0133585 A1 * | 6/2010 | Kim | | C30B 25/10 257/184 |
| 2010/0176371 A1 | 7/2010 | Lochtefeld | | |
| 2010/0193795 A1 * | 8/2010 | Fritzemeier | | H01L 21/02425 257/64 |
| 2011/0062496 A1 * | 3/2011 | Kouvetakis | | H01L 21/02381 257/192 |
| 2011/0146756 A1 * | 6/2011 | Sasaki et al. | | 136/246 |
| 2011/0220936 A1 * | 9/2011 | Fujimoto | | H01L 33/38 257/98 |
| 2011/0266595 A1 * | 11/2011 | Hata | | H01L 21/02381 257/190 |
| 2012/0063717 A1 * | 3/2012 | Grenouillet | | G02B 6/13 385/14 |
| 2012/0168803 A1 * | 7/2012 | Lee | | H01L 33/40 257/98 |
| 2013/0039615 A1 * | 2/2013 | Nguyen | | G02B 6/12004 385/14 |
| 2014/0020748 A1 * | 1/2014 | Green | | C23C 14/06 136/256 |
| 2015/0226918 A1 * | 8/2015 | Bauters | | H01L 31/105 385/14 |

OTHER PUBLICATIONS

Liu, Jifeng et al., Ge-on-Si Laser Operating at Room Temperature, Optics Letters, vol. 35, No. 5, Mar. 1, 2010, 3 pages.

Miller, David A.B., Physical Reasons for Optical Interconnection, Int. J. Optoelectronics 11, 155-168, 1997, 12 pages.

Liu, Jifeng et al., Tensile-strained, n-type, Ge as a Gain Medium for Monolithic Laser Integration on Si, Optics Express 11272, vol. 15, No. 18, Sep. 3, 2007, 6 pages.

Koo, Kyung et al., Compact Performance Models and Comparisons for Gigascale On-Chip Global Interconnect Technologies, IEEE Transactions on Electron Devices, vol. 56, No. 9, Sep. 2009, 12 pages.

Koo, Kyung-Hoae et al., Compact Performance Models and Comparison for Giga-Scale On-Chip Global Interconnect Technogologies, Center for Integrated Systems, ElectricalEngineering Department, Stanford University, California, 55 pages.

International Search Report, mailed Apr. 22, 2013, International Application No. PCT/US13/24759, 2 pages.

Written Opinion of the International Searching Authority, mailed Apr. 22, 2013, International Application No. PCT/US13/24759, 5 pages.

International Preliminary Report on Patentability, mailed Aug. 12, 2014. International Application No. PCT/US13/24759, 6 pages.

Non-Final Office Action, Mailed Feb. 15, 2017, Taiwan Patent Application No. 102104672, filed Feb. 6, 2013, 19 pgs.

\* cited by examiner

LASER USING LOCALLY STRAINED GERMANIUM ON SILICON FOR OPTO-ELECTRONIC APPLICATIONS

FIELD

Subject matter herein relates to formation of germanium devices on silicon on insulator structures.

INFORMATION

There has been considerable effort to integrate germanium (Ge) with silicon (Si). Ge has a smaller bandgap and with tensile-strained heteroepitaxial growth, with an optical absorption band edge up to 1600 nm wavelength. With strain up to 1.7%, Ge may also provide a direct bandgap material, suitable for light emission. Heteroepitaxial growth techniques including, but not limited to, chemical vapor deposition (CVD), have been developed to grow high-quality crystalline germanium and to reduce a number of crystal defects introduced by a lattice constant mismatch between silicon and germanium. It has further been shown that germanium can be selectively grown on silicon using a silicon dioxide mask, reducing the number of defects to a greater extent.

Optical data communications networks integrated in silicon based processor chips may provide significant benefits in increasing processing speed, efficiently implementing software, and reducing power consumption to enable large, multi-core processor networks to be implemented. Applications of these processor chips include high performance computing and large data centers. Also, optical networks can provide significant reduction in power requirements for networking in advanced processor chips, with the power savings advantage increasing with data rate and communication link distance.

SUMMARY

In one aspect of an implementation, a device may comprise a first semiconductor layer; and a second semiconductor layer comprising germanium formed over the first semiconductor layer at an elevated temperature. In one aspect, a difference between a heat expansion coefficient of the first layer and a heat expansion of the second layer imparts a tensile strain on the second semiconductor layer as the first and second semiconductor layers cool to an ambient operational temperature. It should be understood, however, that this is merely an example implementation and claimed subject matter is not limited in this respect.

BRIEF DESCRIPTION OF THE FIGURES

Non-limiting and non-exhaustive features will be described with reference to the following figures, wherein like reference numerals refer to like parts throughout the various figures.

DETAILED DESCRIPTION

Reference throughout this specification to "one example", "one feature", "an example" or "one feature" means that a particular feature, structure, or characteristic described in connection with the feature and/or example is included in at least one feature and/or example of claimed subject matter. Thus, the appearances of the phrase "in one example", "an example", "in one feature" or "a feature" in various places throughout this specification are not necessarily all referring to the same feature and/or example. Furthermore, the particular features, structures, or characteristics may be combined in one or more examples and/or features.

Optical devices for use in processors or communication networks may incorporate germanium in the formation of silicon-compatible photo detectors or lasers fabricated in a complementary metal oxide semiconductor (CMOS) process flow. With an electrically pumped germanium laser, an optical source may be integrated in a chip instead of having to be coupled from the outside using fiber or hybrid chip to chip bonding incurring inherent losses. In addition, III-V material-based lasers have significant performance degradation at temperature environments encountered in the processing chip die, compared with germanium which can operate over the full processor temperature range.

Figure 1A:
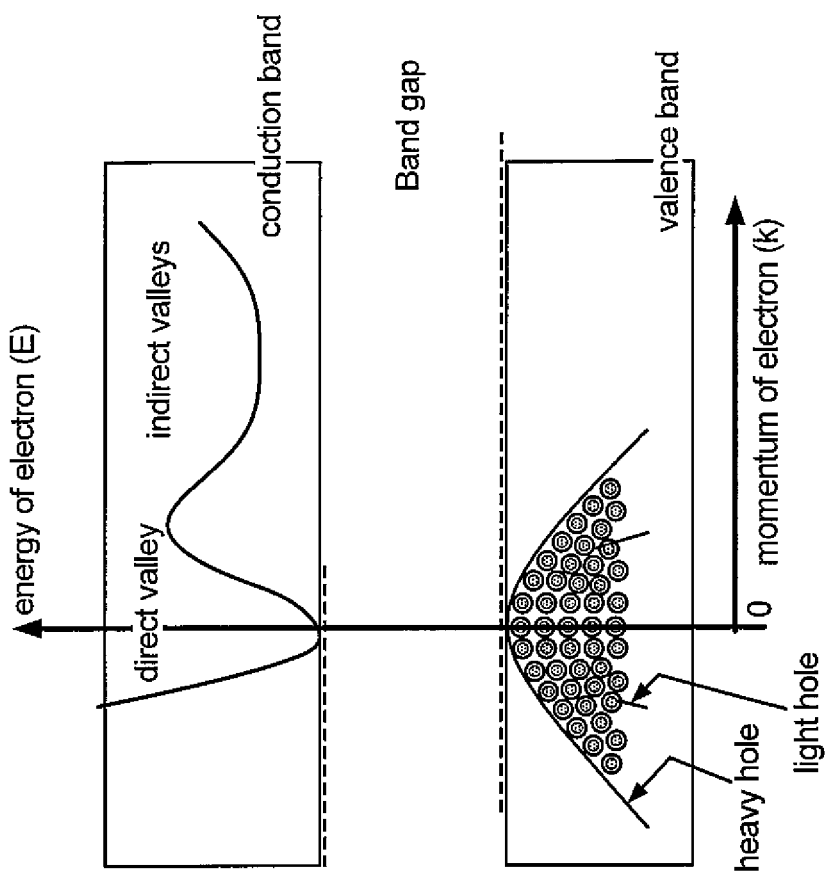
FIG. 1A is an energy band diagram of an indirect bandgap material such as germanium according to an embodiment.
Figure 1B:
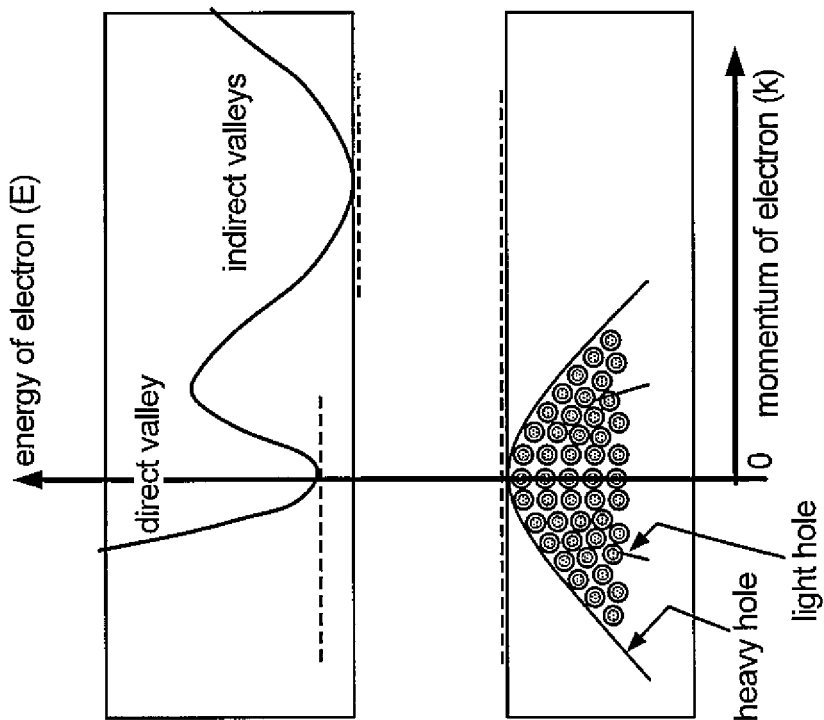
FIG. 1B is an energy band diagram of a direct bandgap material such as GaAs according to an embodiment.

Germanium laser devices may be formed by modifying the material's indirect band gap behavior, unlike laser devices formed with other materials such as InGaAs. This may make photo-generation process very inefficient in operation. Germanium has also been used for silicon-compatible photo detectors and meets the requirement of being able to be grown directly on silicon and fabricated in a complementary metal oxide semiconductor (CMOS) process flow. As shown in FIG. 1(a), germanium is typically an indirect band gap material, unlike conventional laser materials such as InGaAs as shown in FIG. 1(b). This makes the photo-generation process very inefficient. However, as pointed out above, the energy difference between its direct and indirect band gaps is only 136 meV. This energy difference is small enough that the band gap can be modified so the material acts as a direct bandgap material to support the stimulated light amplification mechanism enabling formation of a laser.

FIGS. 1A and 1B illustrate variations in electron energy in a conduction band for an indirect band gap and direct band gap materials according to an embodiment. Indirect band gap material in FIG. 1A may comprise germanium. In particular embodiment, as shown in FIG. 1A, to distort an energy band structure to mimic an energy band structure of a direct band gap material (e.g., as shown in FIG. 1B), germanium may be: (1) strained to force a direct valley Γ lower; or (2) doped with n-type material to fill indirect valleys L up to a level of direct valley Γ. This may enable a population inversion in a direct bandgap to form, leading to strong light emission properties for direct band gap transitions. Although these actions may be used independently to achieve a desired result, one approach is to use both methods in combination. For example, relying solely on application of strain may lead to a shift of laser transmission wavelength to longer wavelengths, which may impact corresponding detector sensitivity. Gain material may be coupled with an efficient resonator to form a laser, for example.

In a particular implementation, a growth technique is used for applying a local stress on germanium formed on silicon to significantly improve the performance of light emission and absorption. A tensile strain and bandgap of germanium may permit efficient absorption of near infrared optical signals. For light detection, electron-hole pairs generated in response to absorption may be collected efficiently using suitable electrodes formed on a germanium detector. Physical dimensions of the detector may be adjusted for optimal light absorption. For light emission, a proper hetero-junction and doping profile may allow carrier injection to achieve proper gain for laser operation. A quantum well type heterojunction can be used to further improve the optical gain and efficiency.

As discussed below, laser transmitters and photo detectors may be formed on the same chip coupled by waveguides connecting laser transmitters to the photo detectors. Among other things, this permits high-speed transmission of information between devices within a chip with very low losses. By using the same process steps to form laser transmission devices and photo detectors on the same device, a total number of process steps for forming a chip may be reduced. Also, forming lasers for transmission and photo detectors to receive transmissions from the lasers in the same process steps may allow for a tight coupling of transmission wavelengths by the laser devices, and sensitivity to these wavelengths at the photo detector devices.

Figure 2:
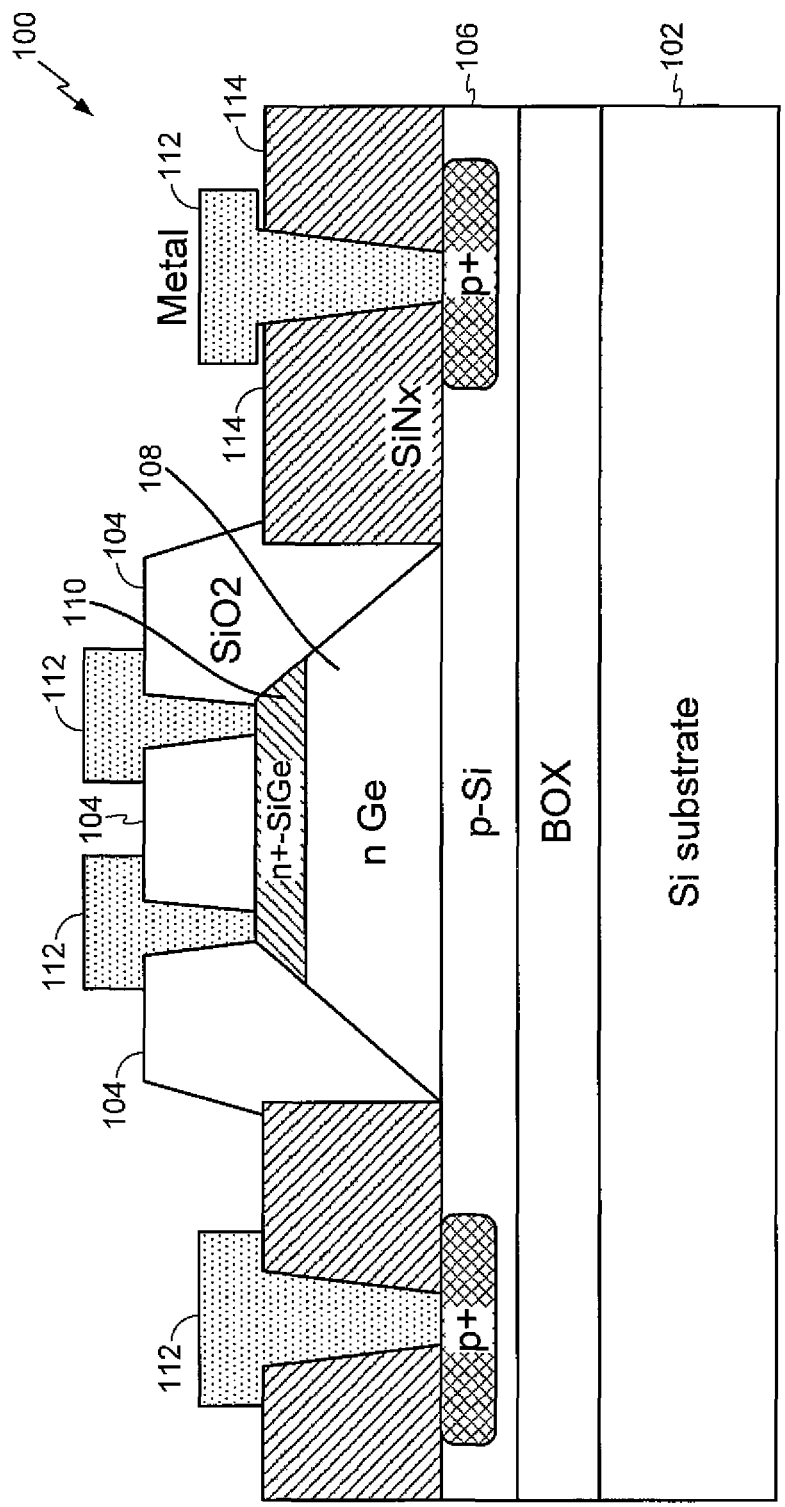
FIG. 2 is a cross-section of a locally stressed silicon germanium hetero structure according to an embodiment.

In one embodiment, as illustrated in FIG. 2, a silicon layer 106 may be formed in a chemical vapor deposition step. An oxide layer 104 comprising $SiO_2$ is grown or deposited on top of Si layer 106 as a selective growth mask during germanium growth. Portions of oxide layer 104 may be selectively removed using either wet chemical etching or plasma etching following an optical photolithography patterning, for example. Following cleaning steps, the wafer may progress through a subsequent CVD step to grow a germanium layer 108. During growth, Ge layer 108 grows on exposed Si regions of layer 106 but does not grow on remaining portions of $SiO_2$ of oxide layer 104. The thickness of Ge layer 108 may be adjusted based, at least in part, on a particular application. A top layer 110 may be grown continuously following formation of Ge layer 108. While top layer 110 is shown as being formed as a SiGe layer, in other embodiments top layer 110 may be formed as a silicon layer or a carbon-doped SiGe layer. Layer 110 may be formed by doping via implantation and high temperature annealing using diffusion doping (e.g., to form SiGe or SiGe:C).

Figure 5:
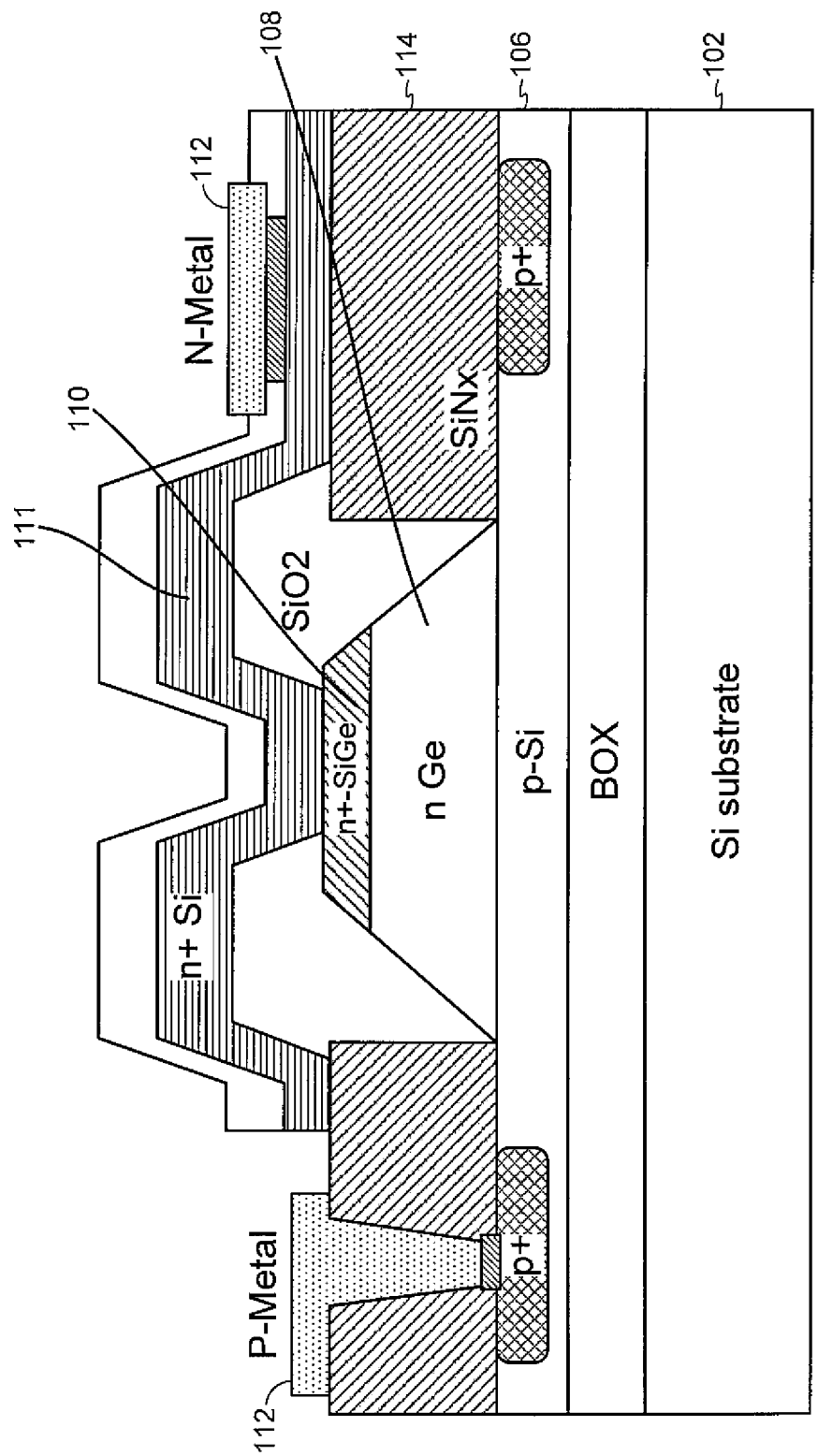
FIG. 5 is a cross-section of a locally stressed silicon germanium hetero structure with connectors coupled to the hetero structure through a top side according to an embodiment.

A particular energy and dose of the implantation may be chosen to introduce minimal defects inside the produced layer 110. The implanted structure may then be annealed under temperature between 600-850° C. to recover defects and activate dopants. Side and over-layer stress films (e.g., $SIN_x$ layer 114) may then be deposited and patterned to provide additional local stress from the side and the top. Side and over-layer stress films may also serve as insulation and passivation. Metal electrodes 112 may be formed and positioned to connect to a bottom side of strained germanium layer 108 through silicon layer 106 as appropriate for particular applications. In an alternative embodiment, as shown in FIG. 5, metal electrodes may be formed to connect to a top portion of SiGe layer 110 through a silicon layer 111 formed on top.

In an alternative embodiment, top layer 110 may be doped using in-situ controlled doping during material growth. In this particular implementation, a whole p-i-n junction may be made in the CVD chamber to ensure high quality, low defect single crystal film with clean interfaces.

In one embodiment, germanium layer 108 is formed at an elevated temperature (e.g., 350 to 650° C.) to form a heteroepitaxial germanium layer.

In this step, the already formed silicon layer 106 is also maintained at the elevated temperature. Here, it is recognized that silicon and germanium have different thermal expansion coefficients (e.g., ~2.6 ppm/C.° for Si and ~5.8 ppm/C.° for germanium). While silicon layer 106 and germanium layer 108 adhere to one another at a junction, silicon layer 106 and germanium layer 108 contract at different rates as silicon layer 106 and germanium layer 108 are cooled from the elevated temperature while germanium layer 108 is being formed to an ambient operational temperature (e.g., room temperature) following deposition of germanium layer 108. This imparts a tensile stress to germanium layer 108 at the junction exhibit properties favorable for photo-absorption and photo-emission as illustrated above in FIGS. 1(a) and (b). In other embodiments, different layers of material other than silicon and germanium, but having substantially different thermal expansion coefficients may be used to impart a tensile strain on one of the layers.

In a particular implementation, tensile strain may affect a transmission wavelength of a laser device and spectral response of a photo detector formed in a device. As pointed out above, the same process steps may be used to form a laser and a photo detector in the same device. In addition to reducing manufacturing cost by reducing a total number of process steps to produce a die, matching a tensile strain to germanium forming a laser with a tensile strain to germanium forming a photo detector may enable coupling a wavelength of light transmitted by the laser with a responsiveness or sensitivity of the photo detector to the transmitted light.

According to an embodiment, layers 108 and 110 may provide a hetero junction forming a PN hetero-diode. Also, a top layer 110 may comprise silicon germanium and may provide a compressive stress adding to tensile strain applied to layer 108 discussed above. Top layer 110 may provide an electrical contact interface. Material of top layer 110 may have also have a thermal expansion coefficient that is different from a thermal expansion coefficient of layer 108 to impart to provide a tensile strain to layer 108. Metal contacts 112 may connect layers 108 and 110, and may be used for carrier injection. As pointed out above, germanium layer 108 is under tensile stress by being compressed between silicon layer 106 and top silicon germanium layer 110.

Figure 3:
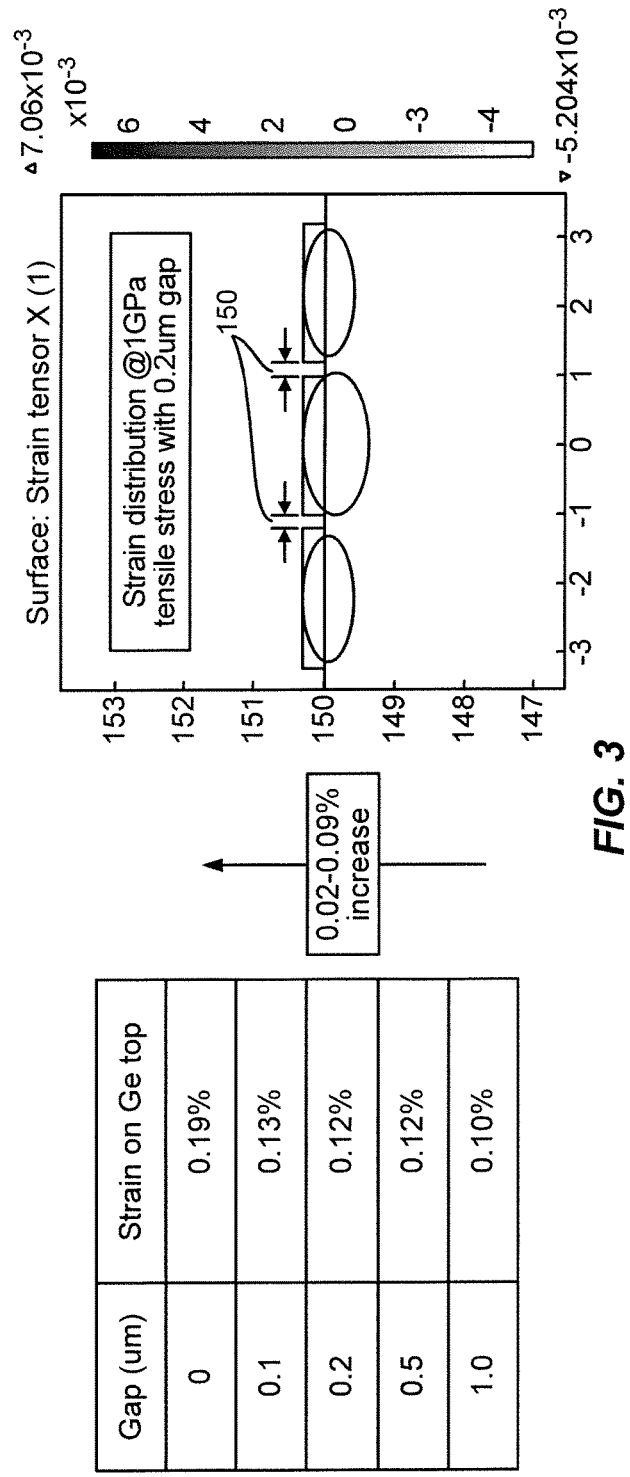
FIG. 3 illustrates variations of gap sizes and their effects on strain on the germanium layer according to an embodiment.

In addition, a lateral compression may be applied to sides of SiGe layer 108 between portions of SiNx layer 114. As illustrated in FIG. 3, a tensile strain on layer 108 may be measured as a percentage. As can be observed, tensile strain on layer 108 may be varied by varying a size of a gap 150 between a germanium portion (e.g., germanium layer 108)

and portions formed to border lateral sides of the germanium portion (e.g., SiNx layer 114). As is illustrated, strain on the germanium portions may increase as gap size decreases.

Figure 4:
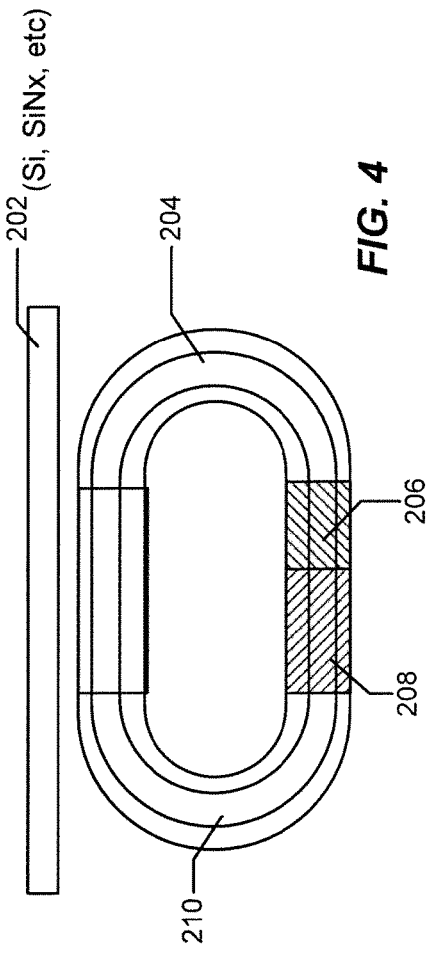
FIG. 4 is a diagram of a ring laser according to an embodiment.

In one embodiment, layer 108 may be patterned and coupled to, or otherwise integrated with a waveguide to transmit light energy between layer 108 and another device. For example, such a waveguide may transit light energy to layer 108 if configured to act as a photo detector. Alternatively, such a waveguide may transmit light energy from layer 108 if configured to act as a laser device. FIG. 4 shows a particular implementation in which device 100 is formed as part of a germanium ring or racetrack laser 212 coupled to a waveguide 202. Here, waveguide 202 may be formed as, or integrated with $SiN_x$ layer 114 and/or silicon layer 106 as shown in FIG. 1. In alternative implementations, waveguide 202 may be formed with silicon on insulator, silicon on selective oxidation, amorphous silicon, poly silicon, germanium, silicon germanium or other material having a refractive index greater than a refractive index of silicon oxide, just to provide a few examples.

Germanium laser 212 may be formed, at least in part, by layers 108 and 110 of FIGS. 2 and 5 under tensile strain as discussed above. Germanium laser 212 may comprise a germanium gain sections 204 and 210, germanium phase section 208 and germanium absorber section 206. In one implementation, an absorber (such as germanium) may be injected at a controlled frequency into layer 108 at about region 206 to enable mode locking and generation of a train of short duration, high intensity pulses. Here, such a controlled frequency may be set to meet phase matching conditions allowing for constructive interference of the pulses. Electrodes (e.g., electrodes 112 of FIGS. 1 and 2) may be formed to connect to the injected absorber to allow for control of a rate of absorption.

In a particular implementation, gain medium to form gain sections 204 and 210 of laser 212 may be formed using an ultra high vacuum chemical vapor deposition (UHV-CVD) growth of germanium in a silicon well with implantation of phosphorous to form n-type dopants. As pointed out above, a first mechanism for introducing strain is growth of germanium at elevated temperature. Dissimilar coefficients of thermal expansion induce strain between germanium layer 108 and silicon layer 106 as the formed layers cool to an ambient operating temperature. In addition, as pointed out above, $SiN_x$ layer 114 may provide internal stressors to impart additional strain to layer 108.

Figure 6:
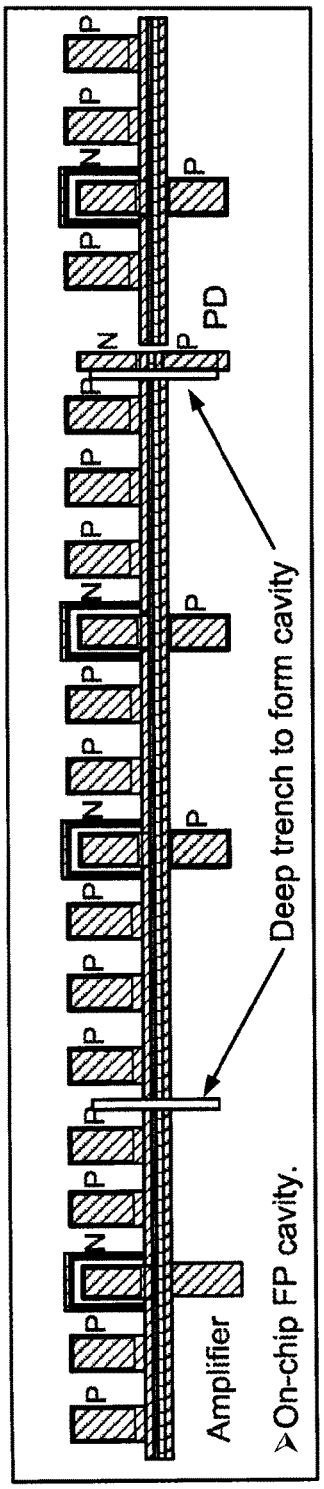
FIG. 6 is a cross-section of a Fabry-Perot germanium laser with an on-chip cavity formed by laser etching according to an embodiment.

FIG. 6 shows a top view of a portion of a device comprising a waveguide 203 coupling to transmit light between laser devices and photo detectors according to an implementation of an on-chip optical communications link. As indicated above, laser devices and photo detectors are formed using the same process steps in particular embodiments. Here, terminal pins extending away from waveguide 203 may be electrically connected to laser devices and photo detectors coupled to waveguide 203.

Figure 7:
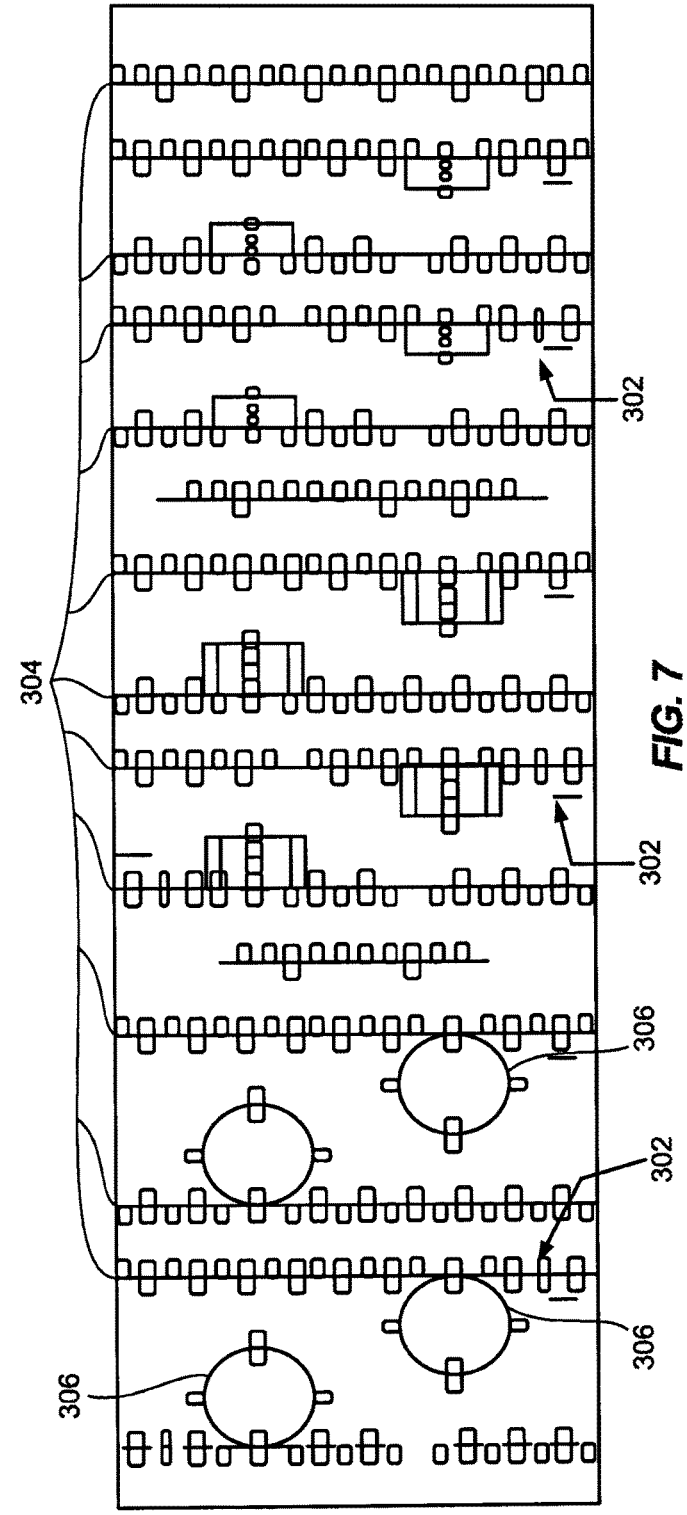
FIG. 7 is a layout of a test chip with ring resonators with a germanium gain medium with varying diameters, according to an embodiment.

FIG. 7 shows a test chip having formed thereon straight waveguides 304 and ring resonators 306 (e.g., racetrack lasers) with the strained germanium gain sections. In one embodiment, dies (such as dies to form the test chip of FIG. 7) may be grown on a 200 mm (8-inch) diameter or larger silicon on insulator (SOI) wafer. Ring resonators with 100, 200, 400 μm or other radii may be formed thereon as discussed above. Output terminals of ring resonators 306 are coupled into their adjacent straight waveguides 304 with a coupling ratio controlled by a separation gap. This may eliminate a need to cleave and polish end facets to form a straight resonator cavity. The chip of FIG. 7 also includes devices where waveguides 304 are terminated with on-chip photo detectors 302 to enable the optical output power to be characterized without coupling the signal out of the chip, which may constitute substantially all key elements of an on-chip optical communications link.

Figure 8:
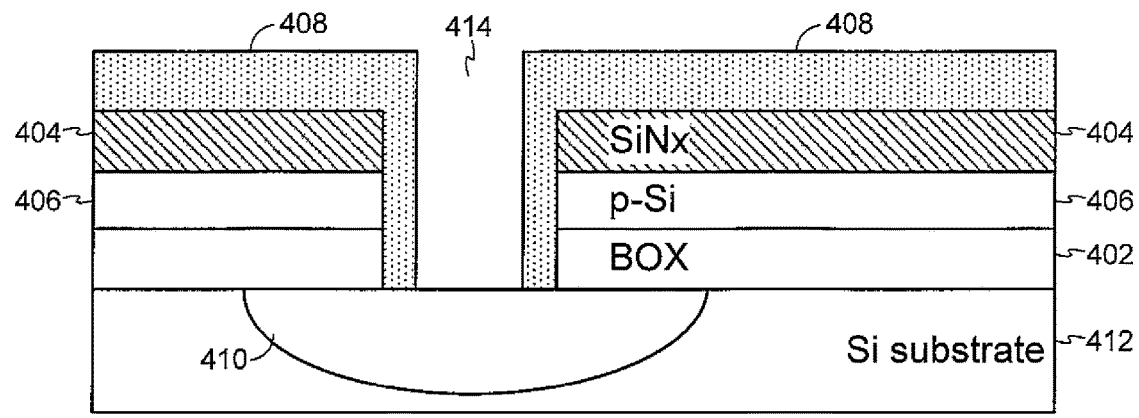
FIG. 8 is a cross-section of an undercut etch used to increase strain according to an embodiment.
Figure 9:
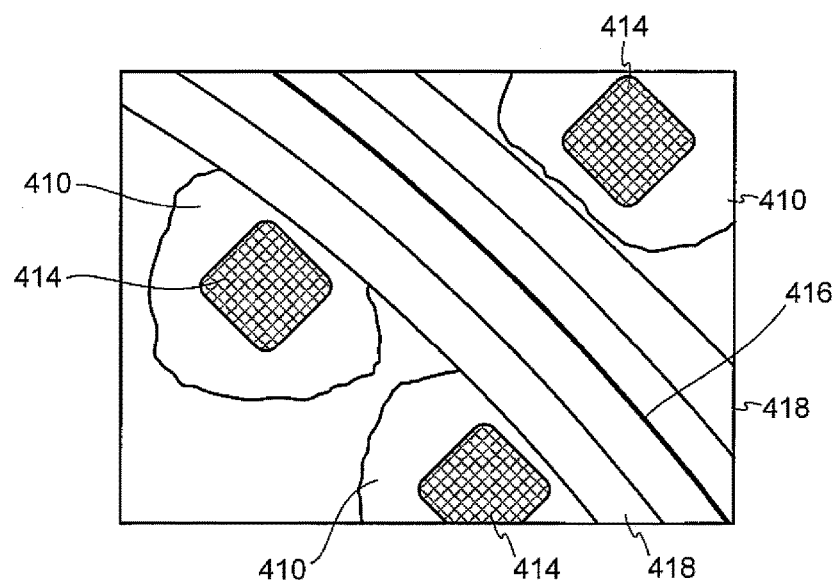
FIG. 9 shows an example plan view of a substrate with an undercut etch according to an embodiment.

Following completion of wafer processing and dicing, an additional undercut etch may be implemented around germanium gain section waveguides to hollow out material under the SOI buried oxide (BOX) layer to increase strain. Has shown in the cross-section view of FIG. 8, an underside may be etched by placement of a photoresist layer 408 layers in a bore 414 to cover layers 404 and 406. Layer 402 is resistant to etching such that a void 410 may be created in silicon substrate 412. Void 410 permits additional mechanical strain to be applied to germanium material formed as a laser or photo detector as discussed above. FIG. 9 Illustrates a top view of the device shown in FIG. 8 in which bores 414 formed over etched voids 414 are placed next to metal connectors 418 and germanium waveguide 416. As mentioned above, etched voids 414 permit additional mechanical strain to be applied to the germanium devices.

The terms, "and", "or", and "and/or" as used herein may include a variety of meanings that also are expected to depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein.

What is claimed is:

1. A method comprising:
   forming a first semiconductor layer at an elevated temperature; and
   forming a second semiconductor layer over said first semiconductor layer while maintaining said first semiconductor layer at said elevated temperature, said second semiconductor layer comprising germanium and adhering to said first semiconductor layer at a junction, wherein a difference in thermal expansion coefficients of said first and second layers imparts a tensile strain on said second semiconductor layer at said junction as said formed first and second layers cool to ambient operational temperature, the tensile strain modifying a band gap of the second semiconductor layer sufficient to enable formation of a laser in the second semiconductor layer, and wherein the tensile strain modifies the band gap of the second semiconductor layer sufficient to increase optical absorption of the second semiconductor layer sufficient to form a photodetector in the second semiconductor layer having a responsiveness or sensitivity matching a wavelength of light transmitted by the laser.

2. The method of claim 1, wherein said first semiconductor layer comprises a silicon substrate and said second semiconductor layer comprises a heteroepitaxial germanium layer formed over exposed portions of said first semiconductor layer.

3. The method of claim 1, wherein forming said second semiconductor layer further comprises doping said second semiconductor layer to impart photo absorption or photoemission properties.

4. The method of claim 3, wherein said doping comprises in-situ doping during formation of said second semiconductor layer using chemical vapor deposition.

5. The method of claim 1, and further comprising forming a third layer over said second layer to provide a hetero junction between said second layer and said third layer; and forming at least one metal contact connecting said second and third layers.

6. The method of claim 5, wherein said third layer provides compressive stress adding to tensile strain to the second layer.

7. The method of claim 5, and further comprising forming electrical contacts connecting the first layer with either the second or third layers.

8. The method of claim 5, wherein said hetero junction forms a PN hetero-diode.

9. The method of claim 5, and further comprising doping said second and third semiconductor layers using implanting through said second and third semiconductor layers followed by annealing.

10. The method of claim 1, forming an amorphous doped silicon connection to conduct carriers to said second semiconductor layer to enable formation of a waveguide.

11. The method of claim 1, wherein said second semiconductor layer is deposited over a region of a surface of said first semiconductor layer, and wherein said second semiconductor layer is under tensile stress compressed in a first direction between said first semiconductor layer and a third semiconductor layer opposite said first semiconductor layer, and compressed in a second direction lateral to said first direction between structures formed on said first semiconductor layer bordering said second semiconductor layer.

12. The method of claim 11, and further comprising controlling stress applied to said second layer in part by controlling a gap in said second direction between said second semiconductor layer and said structures formed on said first semiconductor layer bordering said second semiconductor layer.

13. The method of claim 1, wherein said second semiconductor layer is patterned and coupled to an optical waveguide.

14. The method of claim 13, wherein said second semiconductor layer forms a portion of a germanium laser, the method further comprising:
injecting an absorber in the second layer; and
connecting electrodes to said absorber to control a rate of absorption.

15. The method of claim 14, wherein injecting the absorber further comprises injecting the absorber with an electrical signal at a controlled frequency.

16. The method of claim 13, wherein said optical waveguide is formed with silicon on insulator, silicon on selective oxidation, amorphous silicon, poly silicon, germanium, silicon germanium, silicon nitride or material having a refractive index greater than a refractive index of silicon oxide.

17. The method of claim 1, and further comprising forming an optical cavity with a diffractive pattern in formation of a germanium laser on a silicon layer.

18. A method for manufacturing an integrated device comprising:
forming a first semiconductor layer in a first chemical vapor deposition step, the first semiconductor layer being formed to have a waveguide providing an on-chip communication link;
forming a second semiconductor layer on said first semiconductor layer in a second chemical vapor deposition step, said second semiconductor layer comprising germanium; and
forming a laser device in a first portion of said second semiconductor layer to transmit light energy in said waveguide formed in said first semiconductor layer, wherein a remaining second portion of said second semiconductor layer comprises a photo detector configured to receive said light energy transmitted in said waveguide formed in said first semiconductor layer.

19. The method of claim 18, wherein forming said second semiconductor layer is performed at an elevated temperature, and wherein a difference between a thermal expansion coefficient of the first semiconductor layer and a thermal expansion coefficient of the second semiconductor layer of at least 2.0 ppm/C.° imparts a tensile strain to said second semiconductor layer as said first and second layers cool to ambient operational temperature.

20. The method of claim 18, wherein forming said laser device further comprises injecting an absorber into said first portion of said second layer.

21. The method of claim 18, wherein forming said laser device further comprises implanting phosphorous to form n-type dopants in said first portion of said second layer.

22. The method of claim 1, and wherein the difference in thermal expansion coefficients of said first and second layers is at least 2.0 ppm/C.°.

23. The method of claim 1, wherein the tensile strain modifies the band gap by at least 136 meV.

24. The method of claim 1, wherein modifying the band gap of the second semiconductor layer comprises distorting an energy band structure to mimic an energy band structure of a direct band gap material.

25. The method of claim 1, wherein the tensile strain lowers an energy level of a direct valley of the second semiconductor layer, and wherein the method further comprises n-type doping the second semiconductor layer to raise an energy level of an indirect valley of the second semiconductor layer up to the energy level of the direct valley.

* * * * *